(12) United States Patent
Barth

(10) Patent No.: US 6,515,373 B2
(45) Date of Patent: Feb. 4, 2003

(54) CU-PAD/BONDED/CU-WIRE WITH SELF-PASSIVATING CU-ALLOYS

(75) Inventor: Hans-Joachim Barth, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/751,479

(22) Filed: Dec. 28, 2000

(65) Prior Publication Data

US 2002/0084311 A1 Jul. 4, 2002

(51) Int. Cl.$^7$ .............................................. H01L 23/48
(52) U.S. Cl. ...................... 257/781; 257/738; 257/762; 257/784; 228/180.22
(58) Field of Search ................................. 257/737, 738, 257/780, 781, 784, 762, 690, 735; 438/613–617; 228/180.22

(56) References Cited

U.S. PATENT DOCUMENTS

| | | | | |
|---|---|---|---|---|
| 4,676,827 A | * | 6/1987 | Hosoda et al. ............... | 420/469 |
| 4,761,386 A | * | 8/1988 | Buynoski ..................... | 438/15 |
| 5,622,608 A | * | 4/1997 | Lanford et al. ......... | 204/192.15 |
| 6,057,223 A | * | 5/2000 | Lanford et al. ............. | 438/618 |
| 6,153,521 A | * | 11/2000 | Cheung et al. ............. | 438/687 |
| 6,218,302 B1 | * | 4/2001 | Braeckelmann et al. .... | 438/687 |
| 6,249,055 B1 | * | 6/2001 | Dubin ......................... | 257/758 |
| 6,281,127 B1 | * | 8/2001 | Shue ........................... | 438/691 |
| 6,300,780 B1 | * | 10/2001 | Beaman et al. ............. | 324/754 |
| 6,329,722 B1 | * | 12/2001 | Shih et al. .................. | 257/786 |
| 6,339,022 B1 | * | 1/2002 | Ballantine et al. .......... | 438/660 |
| 6,387,805 B2 | * | 5/2002 | Ding et al. ................. | 438/687 |

OTHER PUBLICATIONS

T. Takewaki et al., Excellent Electro/Stress–Migration–Resistance Surface–Silicide Passivated Giant–Grain Cu–Mg Alloy Interconnect Technology for Giga Scale Integration (GSI), 1995, IEEE, IEDM, pp. 253–256 (10.5.1–.4).*

H. Sirringhaus et al., Self–Passivated Copper Gates for Amorphous Silicon Thin–Film Transistors, Aug. 1997, IEEE, IEEE Electron Device Letters, vol. 18, No. 8, pp. 388–390.*

* cited by examiner

Primary Examiner—George Eckert
(74) Attorney, Agent, or Firm—Jerome J. Norris

(57) ABSTRACT

In an integrated circuit structure, the improvement comprising a wire bonded Cu-pad with Cu-wire component, wherein the Cu-pad Cu-wire component is characterized by self-passivation, low resistance, high bond strength, and improved resistance to oxidation and corrosion, the Cu-pad Cu-wire component comprising:

a metallization-line;

a liner separating the metallization line and a Cu-alloy surrounding a Cu-pad;

a dielectric surrounding the liner; and a Cu-pad bonded to a Cu-alloy wire; the Cu-wire component being characterized by self-passivation areas on:

a) a dopant rich interface in between the Cu-alloy and liner;

b) a surface of the Cu-pad;

c) a surface of the bond between the Cu-pad and the Cu-alloy wire; and d) a surface of the Cu-alloy wire.

7 Claims, 1 Drawing Sheet

CU-PAD/BONDED/CU-WIRE WITH SELF-PASSIVATING CU-ALLOYS

BACKGROUND OF THE INVENTION

1. Field of the Invention

The invention relates to wire bonding of Cu-Pads with Cu-wires using self-passivating Cu-alloys. The self-passivation layer resulting from the dopant rich Cu-alloy protects the Cu from corrosion and oxidation.

2. Description of Related Art

In the art of wirebonding, the current state of the art is to use Al-pads in combination with conventional Al-wedge or Au-ball bonding. However, the introduction of the Al-pads on top of a Cu based metallization is expensive and necessitates additional process steps.

Further, if contemporary bonding of the Cu-wires on Cu-pads is employed, the exposed Cu layer would be highly susceptible to corrosion and oxidation.

The prior art direct chip attachment with wirebonds on conventional overplated, overcoated copper (Cu) pads is costly because costly platings are required on circuit carriers possessing direct chip attach (DCA) wirebonded integrated circuit (IC) chips and wirebond jumper circuits to perform high yield wirebonding on carriers possessing copper circuits. The IC chips are attached to the circuit carrier with an adhesive or solder chip attach material using heat. A circuit covercoat or solder mask covers the copper circuits. In direct chip attach (DCA) wirebond operations, silicon chips are wirebonded to interconnection pads on circuit carriers that possess a combination of barrier underplatings and noble or seminoble metal overplate finishes or surface coatings. The common layered surface finish metallurgies for circuit carrier wirebonding applications are of a nickel (Ni) underplating coating covered by a surface overplating coating layer of gold (Au), palladium (Pd), or silver (Ag). These layered surface finish treatments inhibit diffusion of underlying copper (Cu) circuit metallization to the surface of the overplate and prevent subsequent oxidation of the wirebond pad surfaces. Considerable oxidation of pad surfaces prior to wirebonding can otherwise result in both inability to wirebond with high yield and deterioration of wirebond interconnection reliability. Use of these overplating treatments on copper pads has been used to provide both high yield and high reliability wirebond interconnections.

These plating treatments are costly, due to precious metal content and strict process controls required on plating bath chemistries. Further, when using electrolytic plating, bussing configurations must be provided to all areas requiring a plating treatment. The bussing compromises more efficient wiring configurations and can also prevent maximum usage of available carrier space in both panel and circuit designs. The electrolytic platings can result in higher circuit piece price costs due to inefficient packing of multi-microprocessor circuit configurations on panelized carrier materials including flexible carrier materials, such as polyimide, polyester, and rigid carrier materials, such as a glass epoxy composite or ceramic, liquid crystal polymer (LCP).

U.S. Pat. No. 5,632,438 disclose a direct chip attachment process for aluminum wirebonding on copper circuitization comprising: passing one integrated circuit chip to a carrier; applying to the carrier an attached integrated circuit chip an aqueous cleaning solution containing citric and oxalic acid based additives; applying to the carrier and attached integrated circuit chip a rinse; and wirebonding on copper circuitization carried by the carrier.

A method for improving bond ability for deep-submicron integrated circuit packages is disclosed in U.S. Pat. No. 6,110,816. The method comprises: providing a semiconductor substrate having a top electrically conducting layer, and an overlying layer covering the top electrically conducting layer, and a photoresist applied to the overlying layer; patterning the photoresist to form an array of submicron size holes; etching openings through the overlying layer to the top electrically conducting layer, and forming a rough textured surface profile in the top electrically conducting layer through the opening of the overlying layer; and depositing a passivation film over the overlying layer and forming wiring pad windows for wire ball bonding.

In the art area of wirebonding of Cu-pads with Cu-wires for making integrated circuits, pure Cu-wire bonded to pure Cu-pads provides the best quality bond and lowest resistance; however, pure Cu does not provide a self-passivation effect, and therefore leaves the Cu at peril to corrosion and oxidation. Accordingly, there is a need in this art to provide Cu-wire bonded on Cu-pads so as to provide good bondability and good bond quality coupled with the capacity of self-passivation so as to enable the copper and integrated circuit formed from this fabrication to achieve self-passivation, and thereby resist corrosion and oxidation.

SUMMARY OF THE INVENTION

One object of the present invention is to provide Cu-wire bonded to Cu-pads in a manner so as to provide good bond quality and low resistance, in which the Cu is characterized by self-passivation.

Another object of the present invention is to provide Cu-wire bonded on Cu-pads in a manner so as to provide good bond quality and low resistance, whereby the Cu-wire bonded on Cu-pads is resistant to corrosion and oxidation due to use of self-passivating Cu-alloys.

A further object of the present invention is to provide Cu-wire bonded on Cu-pads to provide good bond quality and lower resistance, by using Cu-wire and Cu-pads fabricated to 100% out of Cu-alloys, to provide Cu-wire bonded to Cu-pads, where the Cu is resistant to corrosion and oxidation due to use of self-passivating Cu-alloys.

A yet further object of the present invention is to provide, Cu-wire bonded to Cu-pads, in which the wire is either a solid Cu-alloy wire or a bi-layer Cu-wire, with an inner core consisting of the Cu-alloy and the outer core being pure Cu, so as to provide good bondability and bond quality upon bonding the copper wire to Cu-pads, to achieve self-passivation from the Cu-alloy.

A further object yet still of the present invention is to provide Cu-wire bonded to Cu-pads wherein the Cu-wire is a bi-layer and the Cu-pad is a bi-layer (Cu-alloy seed layer+pure Cu-fill) to achieve self-passivation and therefore resistance to corrosion and oxidation.

In accordance with the invention good bondability and good bond quality coupled with resistance to corrosion and oxidation is obtained when wire bonding of Cu-pads with Cu-wires is performed using Cu-alloys (Cu—Al, Cu—Mg, and Cu—Li).

BRIEF DESCRIPTION OF THE DRAWING FIGURES

DETAILED DESCRIPTION OF PREFERRED EMBODIMENTS

Figure 1:
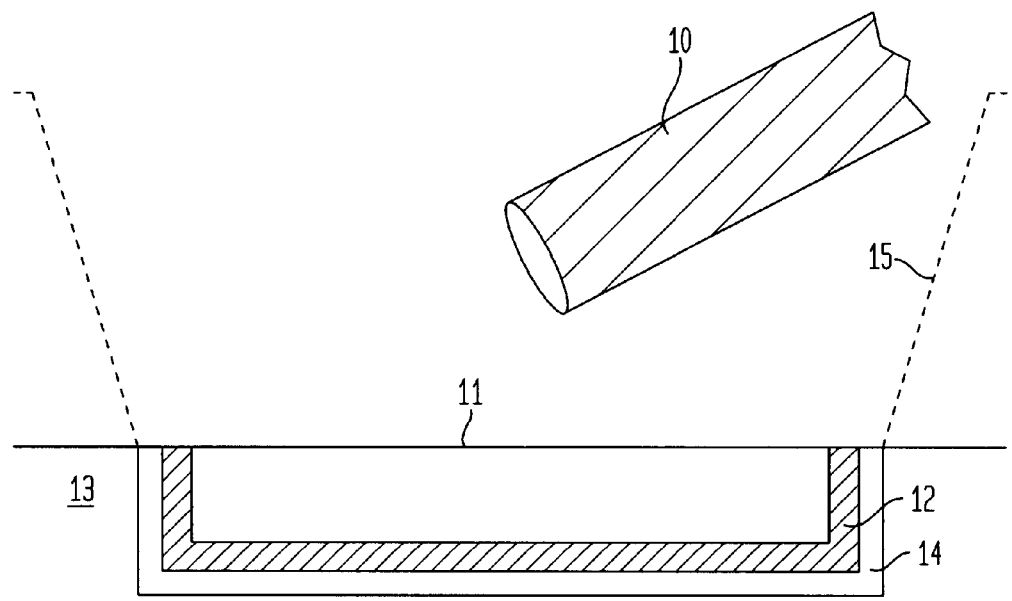
FIG. 1 shows a Cu-alloy wire prior to bonding with a Cu-pad, in which the Cu pad is surrounded by a Cu-alloy, which is surrounded by a liner, all of which are indisposed in a dielectric.

In general, in the context of the invention, the wirebonding of Cu-pads with Cu-wires using self-passivating Cu-alloys for making a semiconductor device or integrated circuit is prepared by the following process sequence:

a) Patterning a (dual-) damascene structure in dielectric to form the wiring and the bond pads;

b) Depositing a metallic liner (PVD, CVD, electroless, or other art known method (this step may be optional by using the optimum amount of Cu-alloy);

c) Depositing Cu-alloy as seed-layer for final Cu-fill (PVD, CVD or other known art methods);

d) Fill of damascene structure with pure Cu (electroplating, CVD, electroless, PVD or other art known methods);

e) Pre-CMP anneal at low temperatures (<200° C.), to form a low resistive Cu film with large Cu grains; however, out-diffusion of the dopants in the Cu-alloy should be suppressed at this point;

f) Cu-CMP to remove the Cu-overfill, followed by liner CMP.

The four possible options for the subsequent process sequence are as follows:

Option A:

7) Post CMP anneal (temperature range: 250° C. to 450° C.) to form the self-passivating dopant rich layer at the Cu-surface and at the Cu-liner interface (it is beneficial to start with a gradual temperature increase to suppress hillock formation. After the initial formation of a dopant-rich surface layer the hillock formation is significantly reduced);

8) Depositing the dielectric cap layer (Cu-diffusion barrier, Si-Nitride, Blok or other art known methods). It is possible to eliminate this dielectric diffusion barrier totally and continue the processing with $SiO_2$ deposition or the deposition of other dielectric materials (e.g. low k materials).

Option B:

7) Depositing of dielectric cap layer (Cu diffusion barrier, Si-Nitride, Blok or other art known methods);

8) Annealing (temperature range: 250° C.–450° C.) to form self-passivating dopant rich layer at the Cu-dielectric cap layer interface and at the Cu-liner interface.

Option C:

7) Post CMP annealing in a temperature range: 250° C.–400° C., this temperature is lower when compared to 9). The post cap layer anneal is approximately 50° C. to form a partially self-passivating dopant rich layer at the Cu-surface and at the Cu-liner interface. It is beneficial to start with a gradual temperature increase to suppress hillock formation. After the initial (partial) formation of a dopant-rich surface layer the hillock formation is significantly reduced;

8) Depositing of the dielectric cap layer (Cu diffusion barrier, Si-Nitride, Blok or other art known methods). It is possible to eliminate this dielectric diffusion barrier totally and continue the processing with $SiO_2$ deposition or the deposition of other dielectric materials (e.g. low k materials);

9) Post cap layer annealing (temperature range: 300° C.–450° C., approximately 50° C. higher than 7) post CMP anneal, to form the final self-passivation layer on the liner and cap layer interface. This approach with the two anneal steps 7) and 8) is beneficial with respect to hillock formation and adhesion.

Option D:

7) Depositing the dielectric cap layer (Cu diffusion barrier, Si-Nitride, Blok or other art known methods). No anneal and therefore no formation of the self-passivating layer at this point of the process sequence. The next steps are the key steps of this invention process:

10) Depositing of a final passivation layer (oxide/nitride combinations);

11) Deposition of a polyimide or photo-sensitive polyimide (PSPI) layer (optional);

12) Patterning of the polyimide (or. PSPI) and the final passivation (including the dielectric cap layer on top of the Cu) by lithographic and etch steps to open the pad area. During the pad opening etch (+post treatments) the self-passivating layer at the Cu/cap layer interface is removed in order to have a clean Cu surface for probing;

13) Probing the chips;

14) Wirebonding (wedge or ball bonding) of the probed pads with the Cu-alloy wires; and 15) Annealing the bonded chips at temperatures between 250° C.–450° C. to form the self-passivating layer on the open Cu-pad surface and on the Cu-wire.

In between the probing step 13) and bonding step 14), a longer time elapses. In order to protect the Cu-pads during this time, an additional step may be introduced to form the self-passivating/protective layer on the probed Cu surface. Shortly before bonding, this layer is removed by wet cleans in order to have a clean Cu-pad surface for optimum bond quality.

Reference is now made to FIG. 1, which depicts a Cu-alloy wire 10 prior to bonding with the Cu-pad 11. The Cu-pad is surrounded by a Cu-alloy 12, which in turn is separated from the dielectric 13 by a liner 14.

Optionally, as shown by the dotted lines, a polyimide 15 may be deposited on top of the dielectric.

Figure 2:
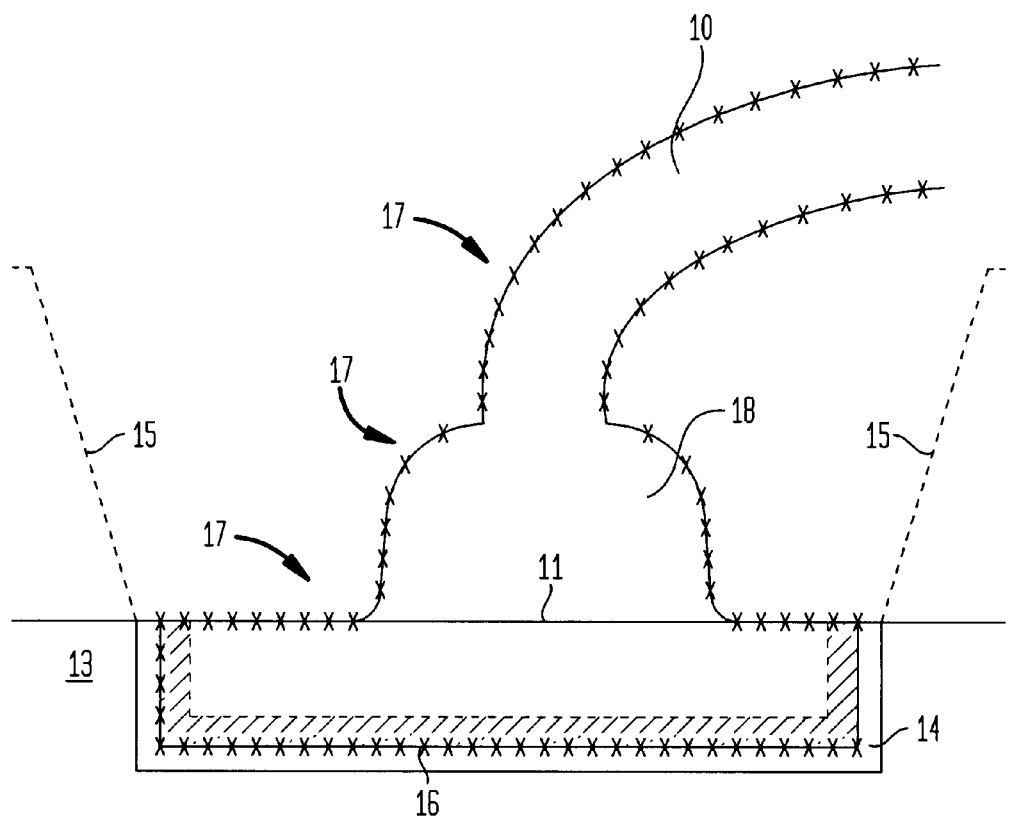
FIG. 2 shows a Cu-alloy wire after wirebonding and annealing to a Cu-pad, in which the formed bond is either a ball or wedge, and in which there is a dopant rich interface layer characterized by self-passivation, as shown by the X's.

As may be seen from FIG. 2, after wirebonding followed by annealing, the passivated dopant rich interface layer 16 and self-passivated Cu-surface 17, both of which are designated by X's are formed. The self passivation is around the Cu-alloy, around the bond ball or wedge 18, and at the juncture of the pad and wire joinings. This dopant rich self-passivating layer is free from hillock structures and protects the Cu from corrosion, oxidation and out-diffusion of Cu into the surrounding semiconductor device areas.

In the context of the invention, the Cu-alloys may be Cu—Al, Cu—Mg, Cu—Li as well as other well-known Cu-alloys, and the concentration of the non-Cu doping material from the other component of the Cu-alloy will range from about 0.1 to about 5.0% atomic weight percent of the Cu-alloy.

Wirebonding of Cu-pads with Cu-wires using self-passivating Cu-alloys is particularly important for improving bondability coupled with protecting the Cu from corrosion and oxidation by virtue of the self-passivation induced by the invention process.

Accordingly, the Cu-pads with Cu-wires using self-passivating Cu-alloys provides comparable bond quality and low resistance to pure Cu-wire bonded on pure Cu-pads and also provides the self-passivation effect not obtained with pure Cu-wire bonded on pure Cu-pads. Stated differently, the bi-layer Cu-wire in combination with a bi-layer Cu-pads (Cu-alloy seed-layer+pure Cu-fill) exhibits optimum characteristics of self-passivation+low resistance and high bond strength.

While certain representative embodiments and details have been shown for purposes of illustrating preferred embodiments of the invention, it will be apparent to those skilled in the art that various changes in the invention disclosed may be made without departing from the spirit and scope of the invention, which is defined in the appended claims.

I claim:

1. In an integrated circuit structure, the improvement comprising a bonded Cu pad-Cu wire component, wherein said Cu pad-Cu wire component is characterized by self-passivation, low resistance, high bond strength, and improved resistance to oxidation and corrosion, said Cu pad-Cu wire component comprising:

I. a liner separating a Cu Pad and a dielectric, wherein said Cu pad is a bi-layer Cu pad comprising Cu alloy seed layer plus pure Cu-fill; and II. a Cu-alloy wire bonded to said Cu pad; said Cu pad-Cu wire component being characterized by self-passivation on:
   a) a dopant rich interface between said Cu pad and said liner;
   b) a surface of a bond between said Cu-pad and said Cu wire; and
   c) a surface of said Cu wire.

2. The structure of claim 1 wherein a passivation layer of an oxide, nitride or combinations of nitrides has been deposited on said dielectric followed by annealing at a atmosphere of from about 250° C. to about 450° C.

3. The structure of claim 2 wherein said dopant is present in a range of from 0.1 to about 5.0 atomic percent of said Cu-alloy.

4. The structure of claim 3 wherein said Cu-alloy is selected from the group consisting of Cu—Al, Cu—Mg and Cu—Li.

5. The structure of claim 4 wherein said Cu-alloy is Cu—Al.

6. The structure of claim 4 wherein said Cu-alloy is Cu—Mg.

7. The structure of claim 4 wherein said Cu-alloy is Cu—Li.

* * * * *